(12) United States Patent
Masuda

(10) Patent No.: US 7,516,381 B2
(45) Date of Patent: Apr. 7, 2009

(54) INTEGRATED CIRCUIT TEST SYSTEM

(75) Inventor: Yoji Masuda, Osaka (JP)

(73) Assignee: Panasonic Corporation, Osaka (JP)

( * ) Notice: Subject to any disclaimer, the term of this patent is extended or adjusted under 35 U.S.C. 154(b) by 441 days.

(21) Appl. No.: 11/407,928

(22) Filed: Apr. 21, 2006

(65) Prior Publication Data

US 2006/0242503 A1 Oct. 26, 2006

(30) Foreign Application Priority Data

Apr. 21, 2005 (JP) ............................. 2005-123957

(51) Int. Cl.
*G01R 31/28* (2006.01)
(52) U.S. Cl. ...................... 714/732; 714/726
(58) Field of Classification Search ............... 714/732, 714/726

See application file for complete search history.

(56) References Cited

U.S. PATENT DOCUMENTS

| 6,275,057 | B1 | 8/2001 | Takizawa |
| 6,661,839 | B1 * | 12/2003 | Ishida et al. ............... 375/240 |
| 6,751,767 | B1 * | 6/2004 | Toumiya .................... 714/738 |
| 6,934,895 | B2 * | 8/2005 | Yun .......................... 714/718 |
| 7,184,917 | B2 * | 2/2007 | Pramanick et al. ......... 702/120 |
| 7,200,784 | B2 * | 4/2007 | Dervisoglu et al. ........ 714/731 |

FOREIGN PATENT DOCUMENTS

| JP | 05099985 A | * | 4/1993 |
| WO | WO 98/43359 | | 10/1998 |

OTHER PUBLICATIONS

"STM-64 multiplexer and regenerator for 10 Gbit/s fiber optictransmission" by Asahi et al. This paper appears in: Communications, 1996. ICC 96, Conference Record, Converging Technologies for Tomorrow's Applications. 1996 IEEE International Conference on Publication Date: Jun. 23-27, 1996 vol. 1, On pp. 165-169 vol. 1 ISBN: 0-7803-3250-4.*

* cited by examiner

*Primary Examiner*—Cynthia Britt
(74) *Attorney, Agent, or Firm*—McDermott Will & Emery LLP

(57) ABSTRACT

A test pattern compressed by an algorithm allowing real-time expansion of data corresponding to each of pins of an LSI is stored in a pattern memory of a pattern generator. A frame processor executes a predetermined program to perform expansion of a test pattern output by the pattern generator by software, generates, based on expanded data, a pulse waveform, and outputs the generated pulse waveform.

8 Claims, 9 Drawing Sheets

INTEGRATED CIRCUIT TEST SYSTEM

BACKGROUND OF THE INVENTION

1. Field of the Invention

The present invention relates to an integrated circuit test system for testing operations of LSIs (large scale integrated circuits) and the like.

2. Description of the Prior Art

With recent increase in size of LSIs, the amount of test pattern data used for testing an LSI has been increased. The increase in test pattern data amount tends to cause a problem in which test pattern data can not be stored in a pattern data memory. In such a case, the capacity of the pattern data memory can be increased. However, increasing the pattern data memory capacity results in increase in costs and also there is a limit for an increase amount. Moreover, if the amount of test pattern data is increased, an increased time is required for loading the test pattern data onto a pattern data memory is increased, so that a time required for setting up a tester (integrated circuit test system) is unexpectedly increased.

A technique for compressing test pattern data and storing the compressed test pattern data has been well known (see, for example, U.S. Pat. No. 6,661,839B1). More specifically, for example, as described in FIG. 109 of U.S. Pat. No. 6,661,839B1, an expansion system for expanding the compressed data at high speed in parallel to each pin is provided and, based on data expanded data by the expansion system, a test signal is sent to a semiconductor integrated circuit.

However, providing the expansion system might cause increase in circuit size and fabrication costs. This problem becomes more apparent, for example, when plural kinds of compression/expansion algorithms are used as shown in FIG. 43 of U.S. Pat. No. 6,661,839B1. Furthermore, it is difficult to compress/expand by a new algorithm and there is also the problem of lack of flexibility.

SUMMARY OF THE INVENTION

It is an object of the present invention is to make it possible to perform test of an integrated circuit using test pattern data with a large data amount in a simple manner without causing increase in circuit size and fabrication costs.

To achieve the above-described object, an embodiment of the present invention provides an integrated circuit test system characterized in that the integrated circuit test system includes: a frame processor provided for each pin of an integrated circuit for generating, based on test pattern data corresponding to the pin, a signal waveform to be sent to the pin; a pin electronics for sending a signal corresponding to the signal waveform to each pin; and a pattern data memory for storing compression test pattern data obtained by compressing the test pattern data, and the frame processor generates the signal waveform while expanding the compression test pattern data.

In another embodiment of the present invention, the integrated circuit test system is characterized in that an expansion program using an expansion algorithm for the compression test pattern data in the frame processor can be set from the outside of the integrated circuit test system.

In still another embodiment of the present invention, the integrated circuit test system is characterized in that the integrated circuit test system further includes a compression/ expansion section for performing expansion of the compression test pattern data and compression of the test pattern data, and the integrated circuit test system is configured to receive/ output non-compression test pattern data corresponding to the compression test pattern data to be stored in the pattern data memory from/to the outside of the integrated circuit test system.

Thus, compression test pattern data stored in the pattern data memory is expanded by executing a program using the frame processor, so that a signal waveform is generated.

DESCRIPTION OF THE PREFERRED EMBODIMENTS

Figure 1:
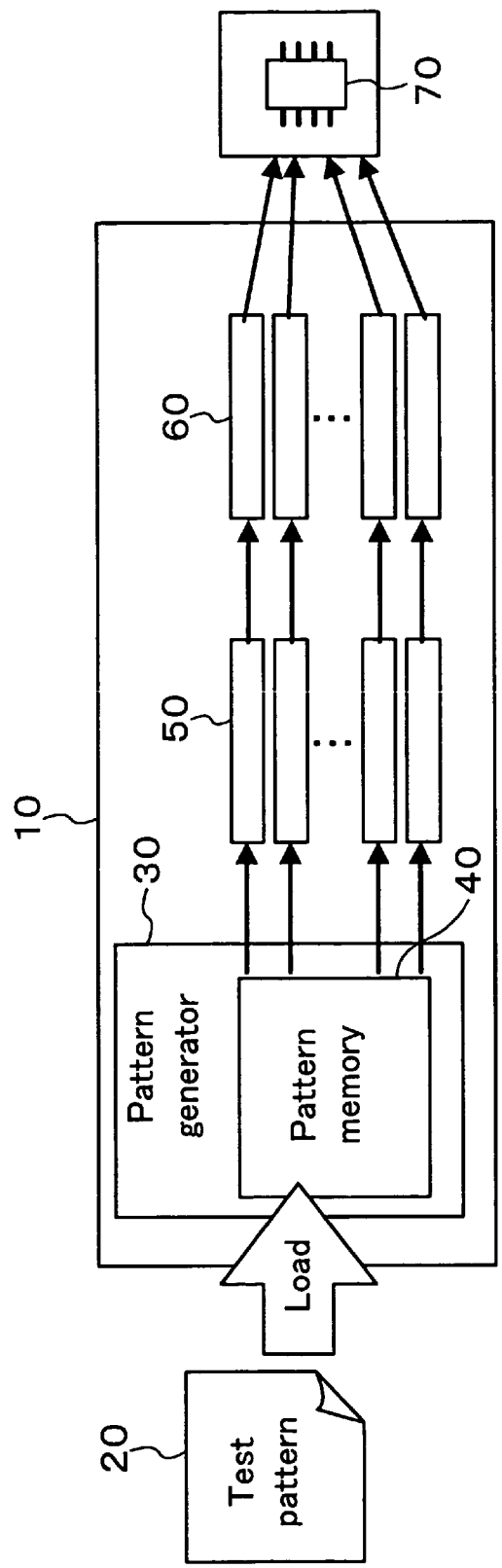
FIG. 1 is a diagram illustrating a configuration of an LSI test system according to a first embodiment of the present invention.

Hereafter, embodiments of the present invention will be described in detail with reference to the accompanying drawings. In each embodiment, each component having substantially the same function as that in other embodiments is identified by the same reference numeral.

Embodiment 1

FIG. 1 is a block diagram illustrating a configuration of an LSI test system 10 according to a first embodiment of the present invention. As shown in FIG. 1, the LSI test system 10 includes a pattern generator 30 including a pattern memory 40 for storing a test pattern 20 (compressed test pattern data), a frame processor 50, provided for each pin of an LSI 70 to be tested, for generating a wavelength, based on logic data output from the pattern generator 30, and also performing pass/ fail judgment based on a signal output from the LSI 70 and a pin electronics 60 for applying an electric signal to the LSI 70 and also receiving an electric signal output from the LSI 70.

More specifically, the test pattern 20 is data compressed by an algorithm which allows real-time (simple manner) expansion of data corresponds to each pin of the LSI 70. The test pattern 20 is loaded in the LSI test system when a test of LSI 70 is performed and stored in the pattern memory 40 of the pattern generator 30.

The frame processor 50 executes a predetermined program to perform expansion of the test pattern 20 output from the pattern generator 30 by software, generates, based on the expanded data, a pulse wavelength, and outputs the generated pulse wavelength.

The pin electronics 60 applies a signal corresponding to the pulse waveform to the LSI 70. The pin electronics 60 also receives a signal output from the LSI 70 and then outputs the received signal to the frame processor 50.

As described above, real-time expansion is performed by the frame processor 50 for generating a pulse wavelength and the like, and there is no need to provide an expansion system. Therefore, test of an integrated circuit using test pattern data with a large data amount can be performed in a simple manner while suppressing increase in circuit size and fabrication costs. Moreover, selective use of plural kinds compression/expansion algorithms can be also achieved with a small circuit size.

Figure 2:
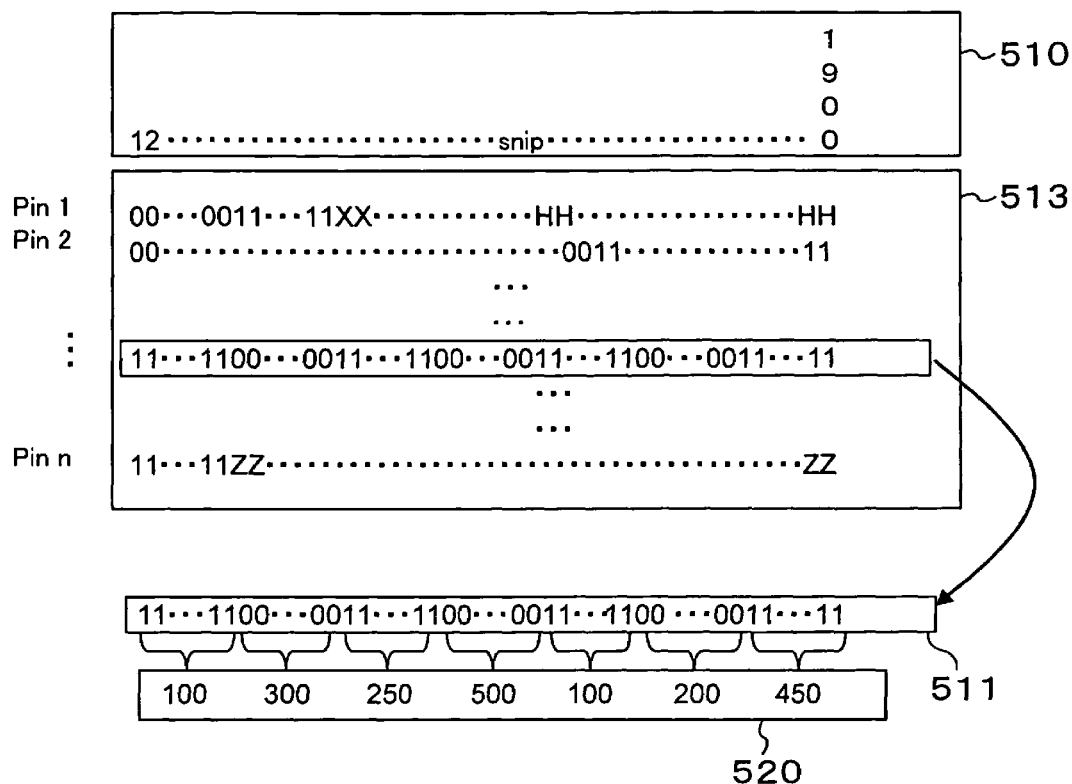
FIG. 2 is an illustration showing an exemplary test pattern.

An algorithm for realizing the above-described compression/expansion is not limited as long as real-time expansion can be achieved. For example, the run-length method may be used. Hereinafter, as an example for the test pattern 20 to be stored in the pattern memory 40, as shown in FIG. 2, data obtained by compressing a test pattern group 513 including 1900 steps having values of 1 through 1900 in a pattern address 510 will be described. The frame processor 50 expands in real time the test pattern 20 which has been obtained by the above-described compression.

Assume that a test pattern 511 for generating an input signal to be sent to one of the pins of LSI 70 is data containing consecutive "0s" and consecutive "1s" arranged as a sequence. For example, the numbers (i.e., the number of steps) of "0s" and "1s" are as shown in a step number table 520. Specifically, if it is assumed that the test pattern 511 is data including 100 steps of "1", 300 steps of "0" and 250 steps of "1" appearing in this order, compression can be performed using the step number table 520 in the following manner.

Figure 3:
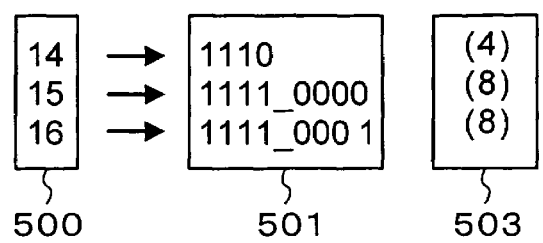
FIG. 3 is an illustration showing an exemplary method in which pattern address numbers are indicated in the hexadecimal system.

For example, step numbers in the step number table 520 are given in a 4-bit unit. A group of 4 bits can express only "0" through "15". Thus, as shown in FIG. 3, a carry is produced at "15 (1111)" and 15 is expressed by "1111_0000". The number of 16 is expressed by "1111_0001" ("_" is a separator for making a number easily seen). Thus, consecutive "1s" of 100 steps in the pattern address 510 of FIG. 2 is expressed by "1111_1111_1111_1111_1111_1111_1010" and this shows that compression to 28 steps as shown in a compression pattern 521 and a step number table 522 in FIG. 4 has been performed. Hereinafter, in the same manner, the test pattern 511 including 1900 steps is finally compressed to 524 steps.

Figure 4:
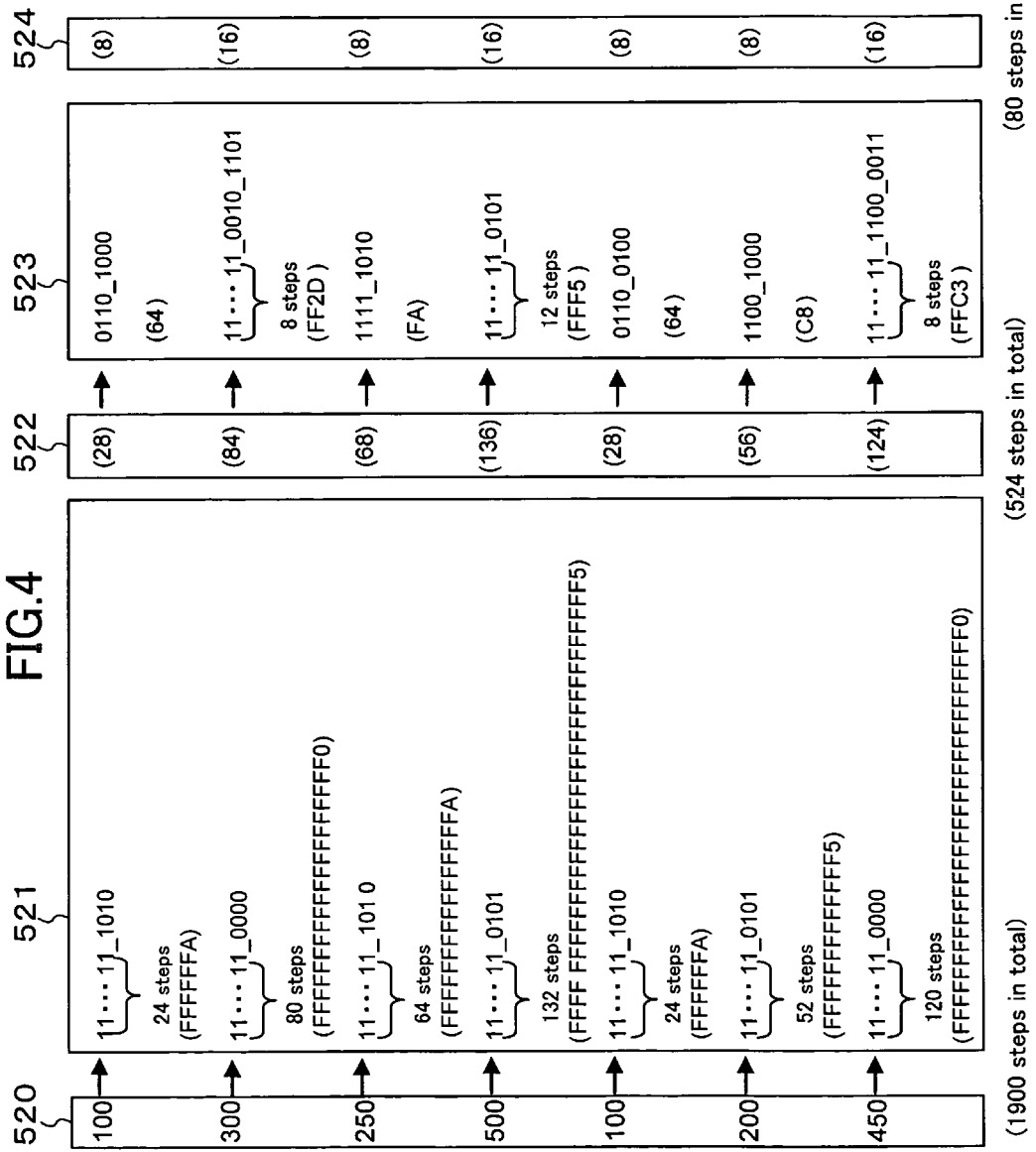
FIG. 4 is an illustration showing an example in which a test pattern is compressed in a 4-bit unit and an 8-bit unit.

Next, using the same technique, the step numbers in the step number table 520 for the pattern address 510 including "0s" and "1s" arranged as a sequence is expressed in an 8-bit unit. In terms of an 8-bit unit, a carry is produced at "255" (1111_1111)" and 255 is expressed by "1111_1111_0000_0000". In this case, as shown in FIG. 4, the test pattern 511 including 1900 steps is compressed to 80 steps.

Among a plurality of different bit units for expressing a step number, i.e., the number of consecutive "0s" or "1s" in the pattern address 510, a bit unit number exhibiting the greatest compression rate is preferably used. The above-described compression is performed to a test pattern separately for each of the logic pins of the LSI 70. Therefore, compression in the most suitable bit unit for each pin can be performed.

In the above-described example, for the purpose of simplification, a bit unit for expressing data is changed by 4 bits. However, the bit unit may be changed by 1 bit.

Figure 5:
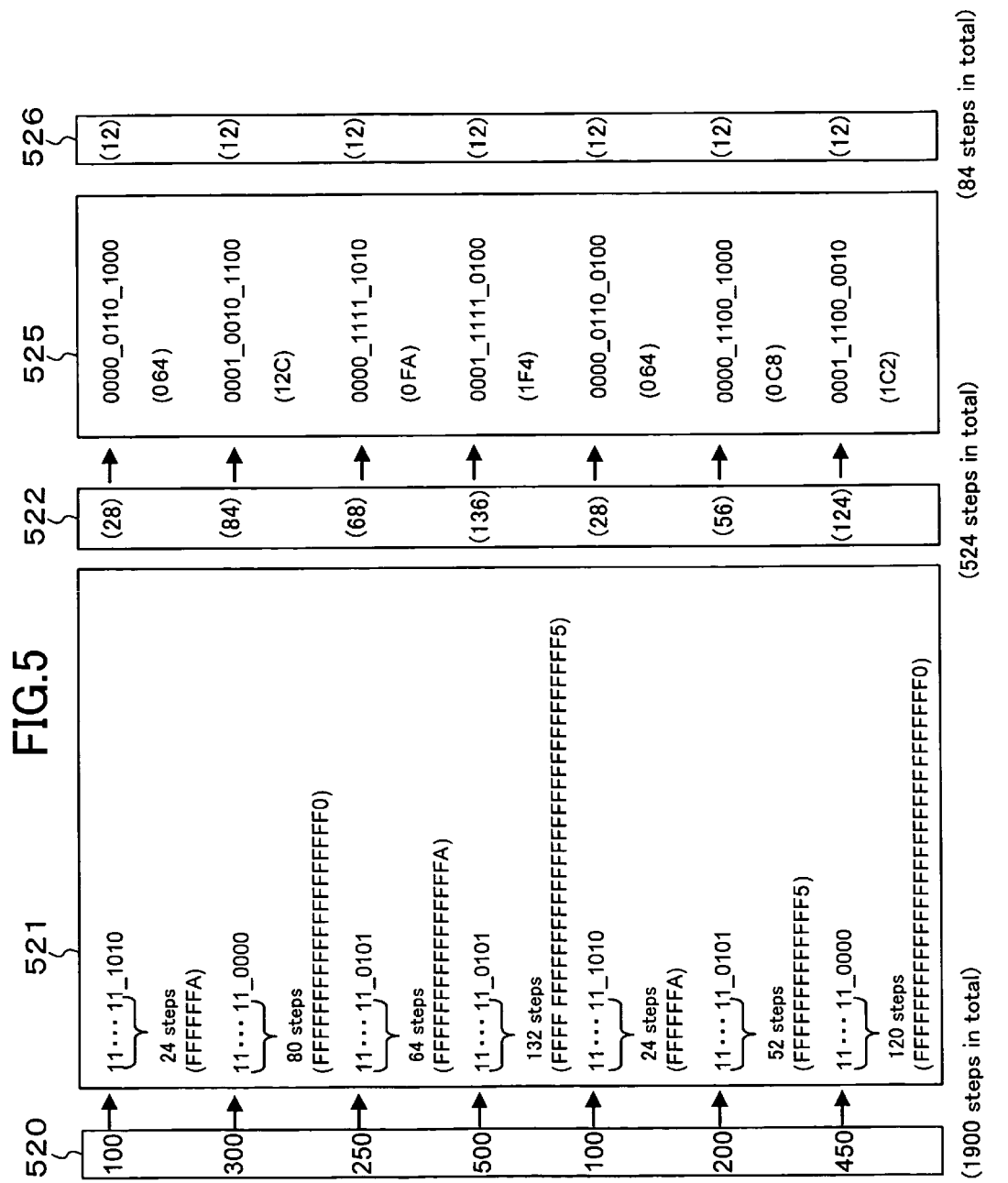
FIG. 5 is an illustration showing an example in which a test pattern is compressed in a 4-bit unit and a 12-bit unit.

Moreover, compression may be tested for three or more different bit units and then one of the three or more bit units may be selected. Assume that in the above-described example, the number of consecutive steps of "0" or "1" in the pattern address 510 is expressed in a 12-bit unit. Compression to 84 steps is performed, so that results shown in the compression pattern 525 and the step number table 526 of FIG. 5 are obtained. Thus, compression in an 8-bit unit is more preferable than compression in a 12-bit unit. Therefore, compression in an 8-bit unit is used.

Compression may be tested while a bit unit number is increased, for example, by 1 bit so that compression is performed in a previous bit unit when a compression rate is reduced, thereby performing compression at the greatest compression rate.

If only one bit unit number is set for a series of test pattern as a whole, judgment process of the bit unit number, based on a header to be described later, may be performed is only once. Thus, a margin for a throughput of the frame processor can be easily given. However, setting for the bit unit number is not limited thereto. A bit unit number with which the greatest compression rate is achieved may be set for each data block with a fixed length. A bit unit number and a block length with which the greatest compression rate may be obtained while the block length is variously changed. The block length may be varied in a series of test pattern. In such a case, data indicating the bit unit number as well as data indicating the block length may be embedded in each block or a start code and a stop code may be embedded at every boundary between blocks.

When the only one unit number is set for a series of test pattern as a while, test compression for selecting the bit unit number does not have to be performed to the entire series of test pattern. Test compression for selecting the bit unit number may be performed to part of the series of test pattern using sampling.

Figure 6:
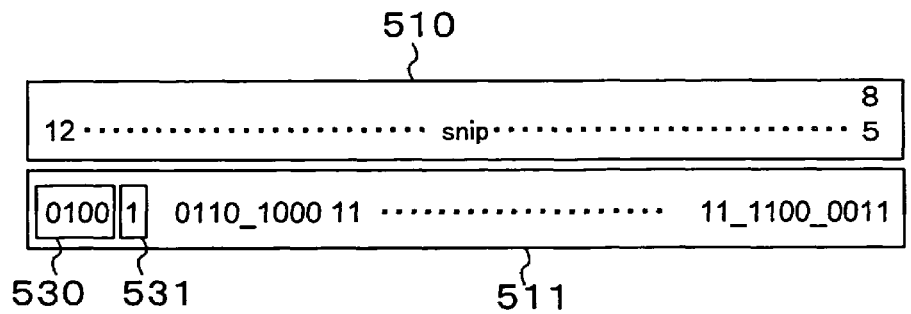
FIG. 6 is an illustration showing an example of results obtained by compressing a test pattern in a 4-bit unit.

As shown in FIG. 6, in the test pattern 511 which has been compressed, a bit 530 for indicating a unit number which has been used in compression and an initial value 531 indicating which "0" or "1" appears at the beginning of the test pattern are added to the beginning of the compressed pattern. By setting the bit 530 to be 4 bits, compression in a 2-15 bit unit can be performed. In the example of FIG. 6, 4 bits for a unit and 1 bit for an initial value 531, i.e., 5 bits in total are added, so that the number of steps of the compressed pattern address including 80 steps becomes actually 85 steps.

A test pattern may be include not only "0s" and "1s" which are values indicating levels of signals received by the LSI 70 but also "Ns" and "Ps" indicating application of negative pulses and positive pulses, respectively, or "Ls" and "Hs" indicating that expected values compared with signals are high and low, respective, and "Xs" indicating that comparison with an expected value are not performed.

Figure 7:
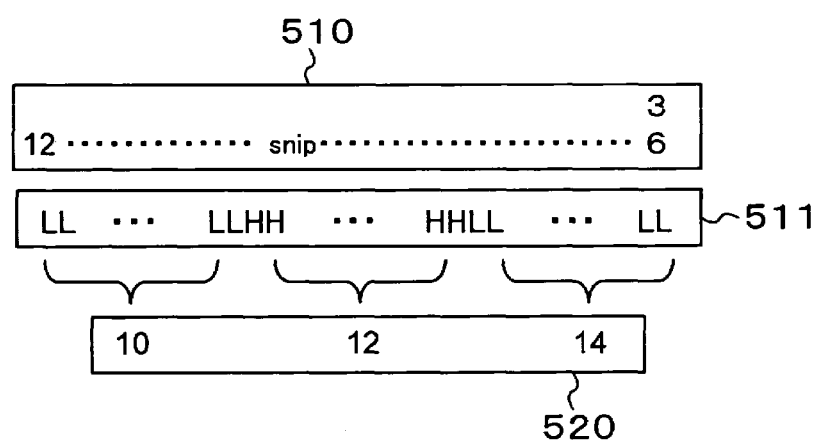
FIG. 7 is an illustration showing an exemplary test pattern including only "Ls" and "Hs".
Figure 8:
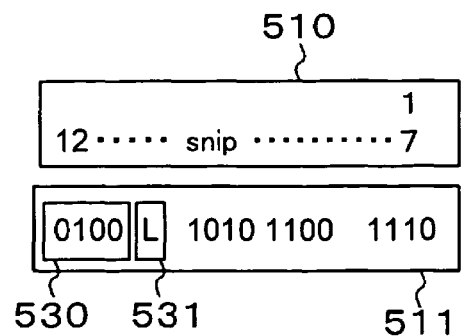
FIG. 8 is an illustration showing an example of results obtained by compressing the test pattern of FIG. 7 in a 4-bit unit.

Specifically, examples where a test pattern includes other values than "0" and "1" will be described. As shown in FIG. 7, when the test pattern 511 includes only "Ls" and "Hs", as in the case where the test pattern 511 includes "0s" and "1s", the numbers of consecutive "Ls" and "Hs" may be expressed in a selected bit unit, which exhibits the greatest compression rate, from bit units such as a 4-bit unit, an 8-bit unit and a 12-bit unit. Thus, the test pattern 511 shown in FIG. 8 can be obtained.

Figure 9:
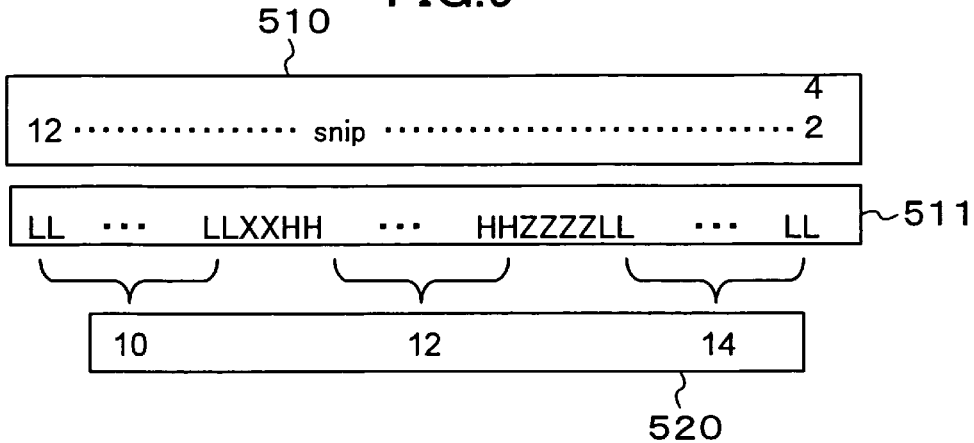
FIG. 9 is an illustration showing an exemplary test pattern including "Ls", "Hs", "Xs" and "Zs".
Figure 10:
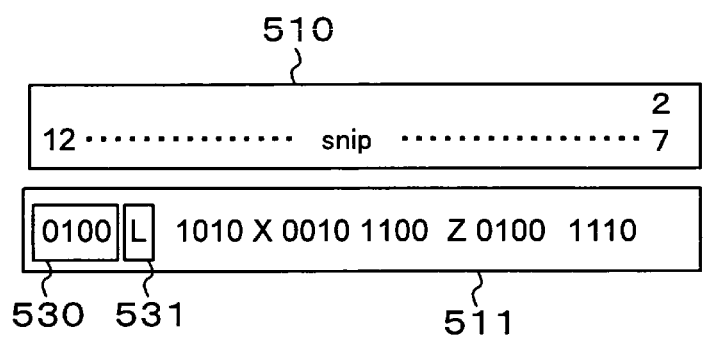
FIG. 10 is an illustration showing an example of results obtained by compressing the test pattern of FIG. 9.

Next, an example of compression methods used when the test pattern 511 includes "Xs" or "Zs" between "Ls" and "Hs" as shown in FIG. 9 will be described. In such a case, a character string includes 4 different values such as "X", "Z", "L" and "H". Therefore, "X" or "Z" is specified for indicating steps of an expected value other than "L" and "H". Accordingly, the test pattern 511 of FIG. 9 is compressed, so that a test pattern 511 of FIG. 10 is obtained.

Figure 11:
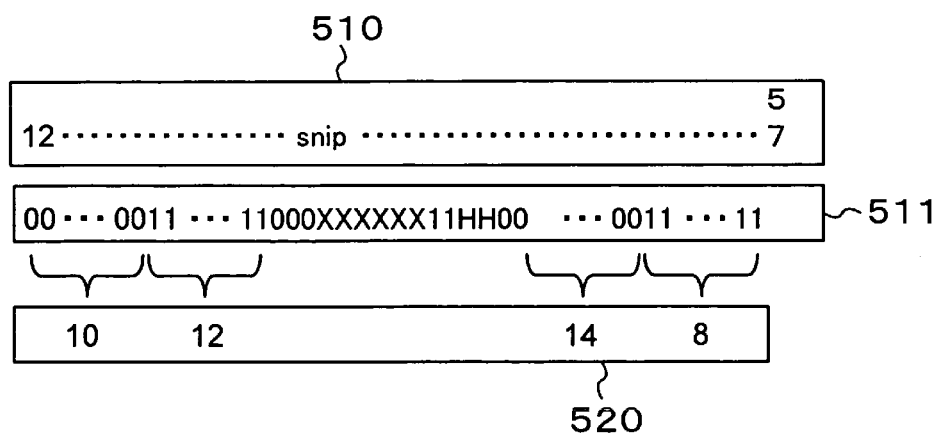
FIG. 11 is an illustration of an exemplary test pattern including "Ls", "Hs", "Xs" or "Zs" between "0s" and "1s".
Figure 12:
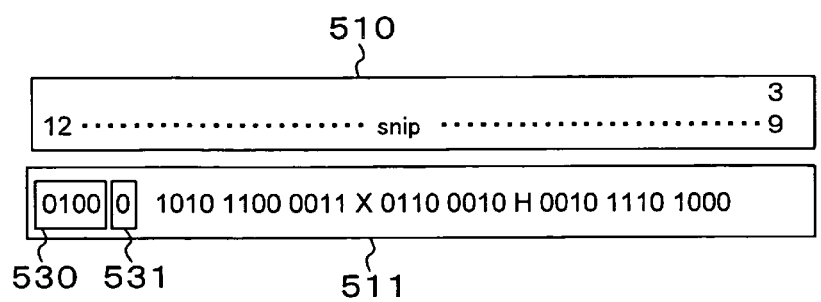
FIG. 12 is an illustration showing an example of results obtained by compressing the test pattern of FIG. 11.

Next, as shown in FIG. 11, an example of compression methods used when the test pattern 511 includes "Ls", "Hs" or "Xs" between "0s" and "1s" will be described. When "0" appears as the initial value 530, it is indicated that the initial numerical symbol is "0" and the next numerical symbol is "1". "L", H" or "X" is specified when the number of steps of "L", "H" or "X" is indicated. Thus, through compression of the test pattern 511 of FIG. 11, the test pattern 511 of FIG. 12 is obtained.

Figure 13:
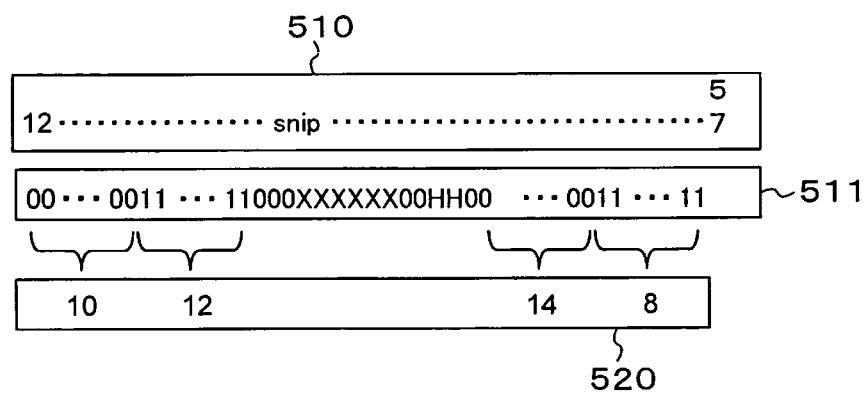
FIG. 13 is an illustration showing an exemplary test pattern including "Ls", "Hs", "Xs" or "Zs" between "0s" and "0s".
Figure 14:
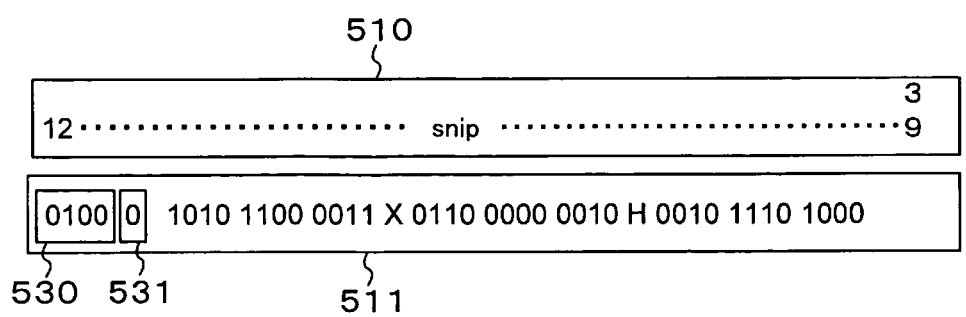
FIG. 14 is an illustration showing an example of results obtained by compressing the test pattern of FIG. 13.

Furthermore, as shown in FIG. 13, an example of compression methods used when the test pattern 511 includes "Ls", "Hs" or "Xs" between "0s" and "0s" or "1s" and "1s" will be described. In the same manner described above, when "0" appears as the initial value 531, it is indicated that consecutive "0s" initially appear and consecutive "1s" follow. "L", "H" or "X" is specified when the number of steps of "L", "H" or "X" is indicated. For example, assume that three "0s" consecutively appear, six "Xs" continue and then two "0s" consecutively appear again. If this is expressed by "0011 X 0110 0010", then "0011 X 0110 0010" can not be distinguished from the case where three "0s", six Xs and two "1s" consecutively appear. Therefore, "0000" which indicates no "1" appears is inserted as a dummy so that "0011 X 0110 0000 0010" is given. Thus, three "0s", six "Xs", no "1" and two "0s", i.e., three "0"s, six "Xs" and two "0s" can be indicated. Accordingly, compression may be performed so that the test pattern 511 of FIG. 14 is obtained after compression.

If various different values such as "L", "H" and "X" are complexly mixed or if a data amount is not eventually reduced even after compression, compression does not have to be performed. In such a case, for example, initial 4 bits of a test pattern which indicate a bit unit number may be set to be "0000" and the like.

Embodiment 2

Figure 15:
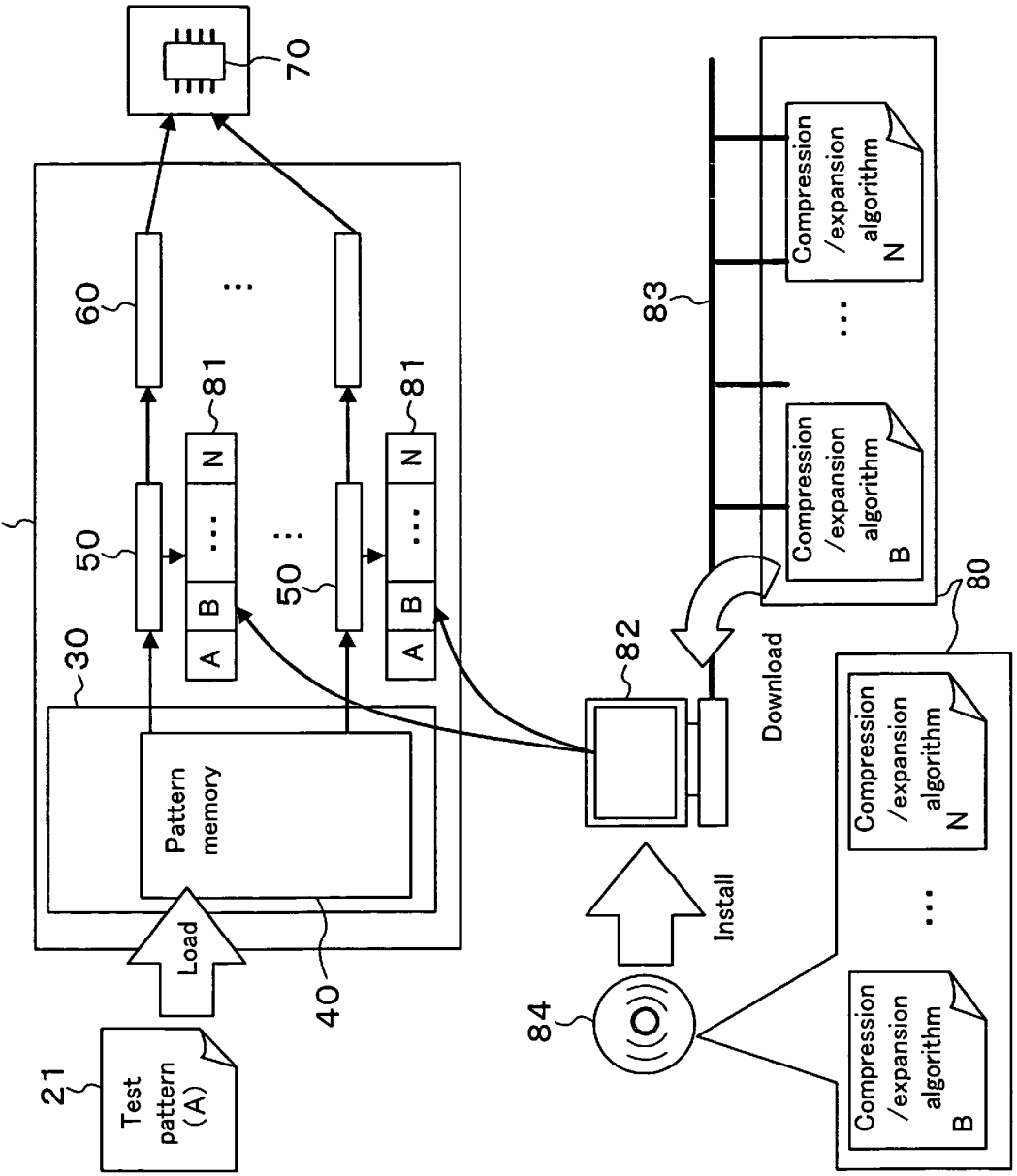
FIG. 15 is a block diagram illustrating a configuration of an LSI test system 11 according to a second embodiment of the present invention.

FIG. 15 is a block diagram illustrating a configuration of an LSI test system 11 according to a second embodiment of the present invention. The LSI test system 11 is, for example, configured to have (store in a memory 81) an expansion program capable of implementing a new compression algorithm 80 installed from network 83, a recording medium 84 and the like via an interface (not shown) and a tester work station 82. As in this system, by executing an installed program by the frame processor 50 to perform expansion, test can be performed, for example, using a test pattern 21 compressed by a compression algorithm newly developed and proposed, so that an algorithm allowing a high compression rate or an algorithm allowing a high expansion rate can be flexibly used.

Embodiment 3

Figure 16:
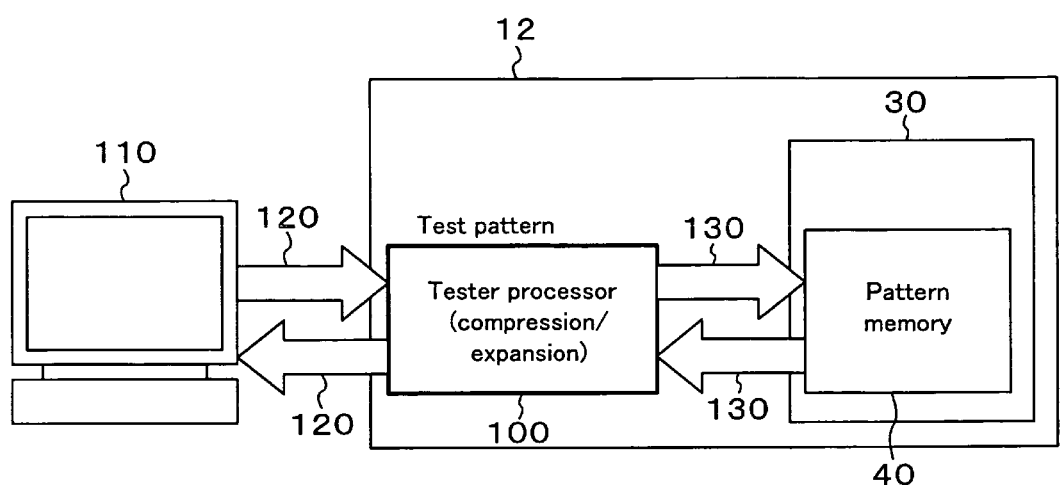
FIG. 16 is a block diagram illustrating a configuration of part of an LSI test system 12 according to a third embodiment of the present invention.

FIG. 16 is a block diagram illustrating a configuration of main part of an LSI test system 12 according to a third embodiment of the present invention. The LSI test system 12 further includes, in addition to the configuration of the LSI test system of the first or second embodiment, a test processor 100 for performing control of the LSI test system. The tester processor 100 expands a compression test pattern 130 stored in a pattern memory 40 and then, for example, outputs an expanded test pattern 120 to a monitor system 110 for display. The expanded test pattern 120 received from the monitor system 110 is compressed and the compressed test pattern 130 is stored in the pattern memory 40.

With the LSI test system 12 configured to have the above-described configuration, for example, a user can execute an edit software (application program) on the monitor system 110 to perform debug such as editing and correcting the expanded test pattern 120, for example, by a keyboard operation. Accordingly, even with use of the monitor system 110 which does not include the compression/expansion function, flexible test can be performed in a simple manner.

As a matter of course, without use of the tester processor 100 (or with the tester processor 100 provided in the monitor system 110), the LSI test system 12 may be configured to receive/output the compression test pattern 130 from/to the monitor system 110, so that compression and expansion are performed in the monitor system 110.

Moreover, the same compression and expansion as those performed by the tester processor 100 may be performed by the frame processor 50.

As described above, an integrated circuit test system according to the present invention has the effect of allowing test for an integrated circuit using test pattern data having a large data amount without causing increase in circuit size and fabrication costs and therefore useful as an integrated circuit test system for testing operations of an LSI and the like.

What is claimed is:

1. An integrated circuit test system comprising:
   a frame processor provided for each pin of an integrated circuit for generating, based on test pattern data corresponding to the pin, a signal waveform to be sent to the pin;
   a pin electronics for sending a signal corresponding to the signal waveform to each pin; and
   a pattern data memory for storing compression test pattern data obtained by compressing the test pattern data,
   wherein the frame processor generates the signal waveform while expanding the compression test pattern data.

2. The integrated circuit test system of claim 1, wherein an expansion program using an expansion algorithm for the compression test pattern data in the frame processor can be set from the outside of the integrated circuit test system.

3. The integrated circuit test system of claim 1, wherein at least one of data received from the outside of the integrated circuit test system and data output to the outside of the integrated circuit test system is the compression test pattern data.

4. The integrated circuit test system of claim 1, further comprising a compression/expansion section for performing expansion of the compression test pattern data and compression of the test pattern data,
   wherein the integrated circuit test system is configured to receive/output non-compression test pattern data corresponding to the compression test pattern data to be stored in the pattern data memory from/to the outside of the integrated circuit test system.

5. The integrated circuit test system of claim 4, wherein the frame processor also serves as the compression/expansion section.

6. The integrated circuit test system of claim 1, wherein as an algorithm for compression and expansion, a run length method in which compression test pattern data corresponding to the number of the same numerical symbols which consecutively appear is generated based on a predetermined unit number in the test pattern data is used.

7. The integrated circuit test system of claim 6, wherein as the compression test pattern data, compression test pattern data obtained by compression based on a unit number resulting in the least data amount is selected for use from a plurality of data compressed based on a plurality of unit numbers.

8. The integrated circuit test system of claim 7, wherein in each block having a predetermined block length, as the compression test pattern data, compression test pattern data obtained by compression based on a unit number resulting in the least data amount is selected for use from a plurality of data compressed based on a plurality of unit numbers.

* * * * *